(12) United States Patent
Park

(10) Patent No.: US 7,354,834 B2
(45) Date of Patent: Apr. 8, 2008

(54) SEMICONDUCTOR DEVICES AND METHODS TO FORM TRENCHES IN SEMICONDUCTOR DEVICES

(75) Inventor: Geon-Ook Park, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 10/746,089

(22) Filed: Dec. 26, 2003

(65) Prior Publication Data
US 2004/0248373 A1    Dec. 9, 2004

(30) Foreign Application Priority Data
Jun. 4, 2003   (KR) ............. 10-2003-0036001
Jun. 4, 2003   (KR) ............. 10-2003-0036002

(51) Int. Cl.
*H01L 21/336* (2006.01)

(52) U.S. Cl. .................... 438/296; 257/510

(58) Field of Classification Search ........ 438/221, 438/296, 359, 424, 435–437; 257/506, 510, 257/395, 397, E21.545, E21.546
See application file for complete search history.

(56) References Cited

U.S. PATENT DOCUMENTS

| 4,696,045 | A |   | 9/1987  | Rosenthal |
|-----------|---|---|---------|-----------|
| 5,413,966 | A | * | 5/1995  | Schoenborn ........... 438/421 |
| 6,001,696 | A | * | 12/1999 | Kim et al. ............. 438/296 |
| 6,069,091 | A | * | 5/2000  | Chang et al. .......... 438/719 |
| 6,074,931 | A | * | 6/2000  | Chang et al. .......... 438/424 |
| 6,110,793 | A | * | 8/2000  | Lee et al. ............. 438/400 |
| 6,214,698 | B1 |  | 4/2001  | Liaw et al. ........... 438/435 |
| 6,313,010 | B1 | * | 11/2001 | Nag et al. ............ 438/435 |
| 6,342,428 | B1 | * | 1/2002  | Zheng et al. .......... 438/424 |
| 6,509,564 | B1 | * | 1/2003  | Suzuki et al. ......... 250/310 |
| 6,521,413 | B1 |  | 2/2003  | Daggett et al. |
| 6,531,413 | B2 |  | 3/2003  | Hsieh et al. .......... 438/782 |
| 2003/0030121 | A1 |  | 2/2003 | Heo et al. ............ 257/499 |

FOREIGN PATENT DOCUMENTS

KR    2003-1409    1/2003

* cited by examiner

*Primary Examiner*—David Vu
(74) *Attorney, Agent, or Firm*—Andrew D. Fortney

(57) ABSTRACT

Semiconductor devices and methods of fabricating the same are disclosed. One example method may include forming sequentially a pad oxide film and a silicon nitride film on an entire surface of a semiconductor substrate, forming the trench by etching the silicon nitride film and the semiconductor substrate up to a predetermined depth, and forming a liner oxide film with a thickness thinner than that of the silicon nitride film on an inner wall of the trench. The example method may also include applying a negative voltage to a back surface of the semiconductor substrate and forming an insulation film to fill the trench on the liner oxide film.

18 Claims, 4 Drawing Sheets

SEMICONDUCTOR DEVICES AND METHODS TO FORM TRENCHES IN SEMICONDUCTOR DEVICES

TECHNICAL FIELD

The present disclosure relates to semiconductors and, more particularly, to semiconductor devices and methods to form trenches in semiconductor devices.

BACKGROUND

Shallow trench isolation (STI) structures have been widely used to isolate areas within semiconductor devices. These STI structures are advantageous to miniaturization of semiconductor devices because a size of a field region is limited to a desired size of a trench by forming trenches in a semiconductor substrate and filling the trenches with insulation material.

Hereinafter, a conventional method of manufacturing the STI structure will be in brief described. FIGS. 1a to 1d are sectional views showing the conventional STI manufacture method.

First, as shown in FIG. 1a, a pad oxide film 2 is deposited at a thickness of about 200 Å on an entire surface of a silicon substrate 1. Subsequently, a silicon nitride film 3 is deposited at a thickness of about 2000 Å on the pad oxide film 2 and a photosensitive film is applied and exposed on the silicon nitride film 3. A pattern of photosensitive film 4 is then formed by removing only the photosensitive film on a region that is to include a trench.

Next, as shown in FIG. 1b, a trench 100 is formed in the silicon substrate 1 by dry etching the exposed silicon nitride film 3, the pad oxide film 2, and the silicon substrate 1 up to a predetermined depth using the pattern of photosensitive film 4 as a mask. The pattern of photosensitive film 4 is removed and then a cleaning process is performed.

As shown, an edge at which a side and a bottom of the formed trench intersect forms a nearly right angle. It is almost impossible to decrease this angle so that the edge is gently slanted.

Next, as shown in FIG. 1c, a liner oxide film 5 is formed at an inner wall of the trench 100 using a thermal oxidation process. According to one example, the liner oxide film 5 is formed at about 60% of its total thickness inside the silicon substrate 1 and at about 40% of the total thickness outside the silicon substrate 1 by a typical thermal oxidation process. The liner oxide file 5 is centered at a surface (shown as a dotted line in FIG. 1c) of the silicon substrate 1 of the trench.

During the thermal oxidation process for the formation of the liner oxide film 5, as an angle of an edge at which a side and a bottom of the trench 100 intersect becomes smaller, it becomes difficult for oxygen molecules to penetrate into the silicon substrate. For example, a nearly vertical trench edge creates a state in which oxygen molecules do not easily penetrate into the silicon substrate.

At this time, because most of deposition processes are performed using only heat in a high temperature without any electric power, the entire surface of the silicone substrate 1 assumes electrical neutrality. Under this state, as shown in FIG. 1d, a field oxide 6 is thickly deposited on an entire surface of the silicon nitride film 3 including the liner oxide film 5 such that the trench 100 is sufficiently buried or filled.

The field oxide 6 is consecutively deposited at the same speed on the silicon nitride film 3 or in the interior of the trench 100 on the liner oxide film 5 with a surface state as shown as a dotted line in FIG. 1d. During the deposition process, the field oxide 6 may create a shape that is difficult to fill. Accordingly, a void 200 in the field oxide 6 may be created in the interior of the trench 100. If this void 200 is excessively large, the void 200 will be exposed when a chemical mechanical polishing is performed to planarize the filed oxide 6. The exposing of the void 200 results in difficulties during the planarization process.

In addition, in a state where the void is exposed after the planarization, when a polysilicon to be deposited for formation of an electrode in a subsequent process enters the void, a leakage current may result, thereby causing erroneous operation of a device and a circuit-short between adjacent devices. These effects are fatal to the operation of the device.

The above problems become more serious as a width of the trench becomes narrower.

One prior approach to filling the trench without any void is disclosed in Korean Patent No. 36355, which discloses a technique by which a composite film structure of an anti-diffusion insulation film and a thermal oxide film is provided between a nitride film liner and a trench in order to minimize a transistor characteristic deterioration due to the nitride film liner. However, this approach has a disadvantage in that a manufacturing process for forming the composite film structure is complicated.

Another approach is disclosed in Korean Patent Application No. 2003-1409, which discloses techniques by which a first liner oxide film formed in an inner wall of a trench is etched away by a wet etching method, a second liner oxide film is thermally grown such that a top surface of the second liner oxide film has a smoothly curved edge, and then a filed oxide is formed on the top surface of the second liner oxide film such that the trench is completely filled without any void. However, because this technique requires a process of wet etching the liner oxide film and two deposition processes, this second prior approach also has a disadvantage of a complicated manufacturing process.

Still other prior approaches are disclosed in U.S. Pat. Nos. 6,531,413 and 6,214,698, which disclose techniques by which an undoped thin film is used for preventing voids, or a gap fill is achieved by two processes. However, since these techniques require a modification of process conditions, it also has a disadvantage of a complicated manufacturing process.

DETAILED DESCRIPTION

Figure 1A:
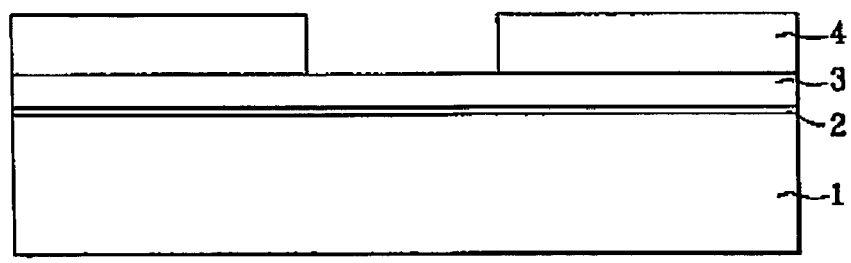
FIGS. 1a to 1d are sectional views showing the results of a method of forming a trench in a conventional semiconductor device.
Figure 1B:
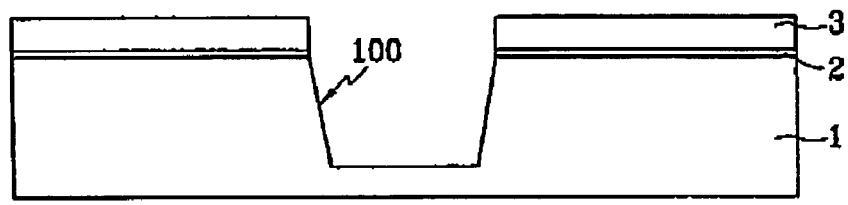
Figure 1C:
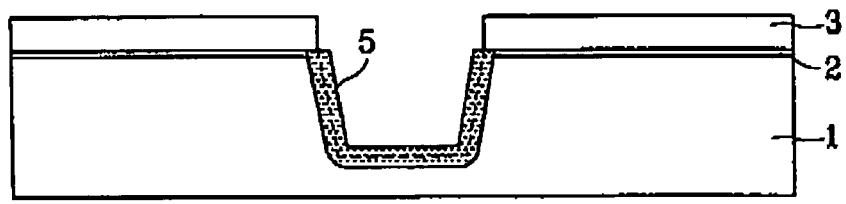
Figure 1D:
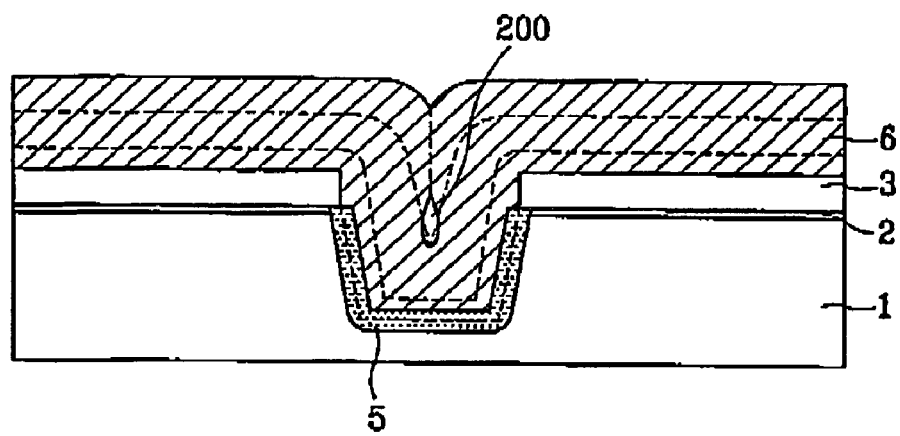
Figure 2A:
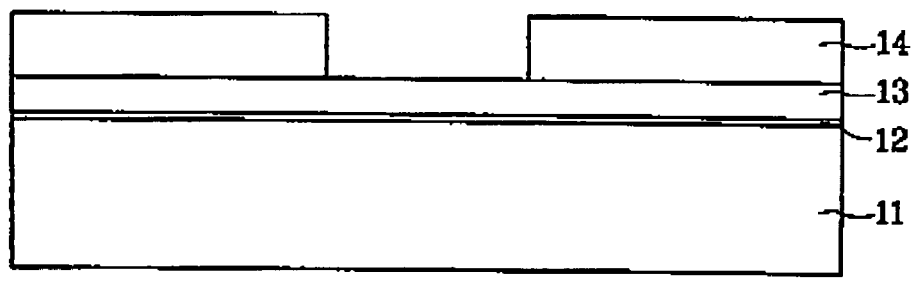
FIGS. 2a to 2f are sectional views showing results of a disclosed example method of forming a trench in a semiconductor device.

First, as shown in FIG. 2a, a pad oxide film 12 is thinly deposited on an entire surface of a silicon substrate 12, and a silicon nitride film 13 is deposited on the pad oxide film 12. A photosensitive film 14 is then applied and exposed on the silicon nitride film 13, and then a pattern of photosensitive film 14 is formed by removing only the photosensitive film on a region to be formed with a trench.

At this time, the pad oxide film 12 is optionally deposited to prevent a stress of the silicon nitride film 13 from being transferred to the semiconductor substrate 11. In one example, the pad oxide film 12 is deposited thinly at a thickness of between about 100-300 Å, for example, 200 Å.

Because the silicon nitride film 13 is made of material having a high selectivity over the pad oxide film, it functions as a buffer layer in a subsequent chemical mechanical polishing process for the field oxide. In one example, the silicon nitride film 13 is deposited at a thickness of 1000-3000 Å, for example, 2000 Å.

Figure 2B:
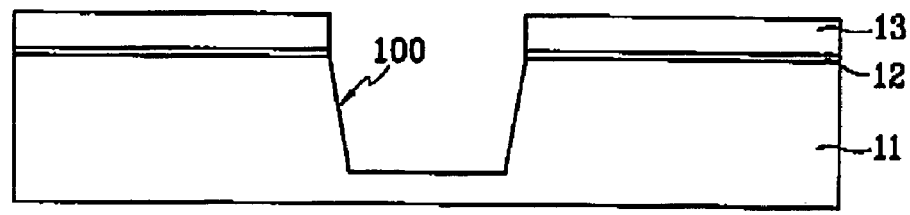

Next, as shown in FIG. 2b, a trench 100 is formed in the semiconductor substrate 11 by dry etching the exposed silicon nitride film 13, the pad oxide film 12, and the semiconductor substrate 11 to a predetermined depth using the pattern of photosensitive film 14 as a mask. Subsequently, the pattern of photosensitive film 14 is removed and a cleaning process is performed.

At this time, because an etching rate of the silicon nitride film 13 is different from an etching rate of the semiconductor substrate 11, process conditions for a dry etching of the silicon nitride film 13 are different from those for a dry etching of the semiconductor substrate 11. Accordingly, the dry etching may be performed in two steps. In more detail, after the silicon nitride 13 is first etched away, the semiconductor substrate 11 is etched away up to a predetermined depth with etching process conditions different from those of the silicon nitride film 13. When etching of the silicon nitride film 13 and etching of the semiconductor substrate 11 are consecutively performed with different process conditions, as described above, etching process time can be shortened.

The trench 100 formed by the etching process has an angled edge at which a side and a bottom of the trench intersect. It is almost impossible to form this edge into a gently slanted shape.

Figure 2C:
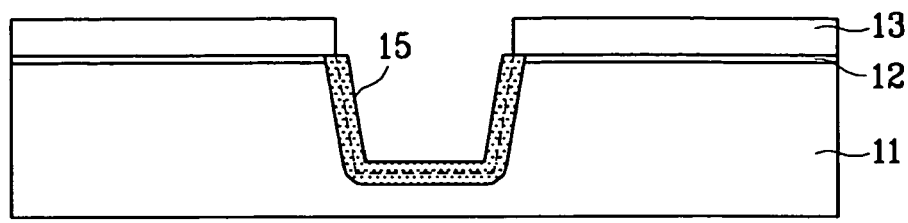

Next, as shown in FIG. 2c, a liner oxide film 15 is formed at an inner wall of the trench 100 using a thermal oxidation process. In one example, the liner oxide film 15 is formed at about 60% of its total thickness inside the silicon substrate 11 and at about 40% of the total thickness outside the silicon substrate 11 by a typical thermal diffusion process, centering at a surface (shown as a dotted line in FIG. 2c) of the semiconductor substrate 11 of the trench. The liner oxide film 15 may be deposited at a thickness of 100-500 Å, for example, 300 Å.

Figure 2D:
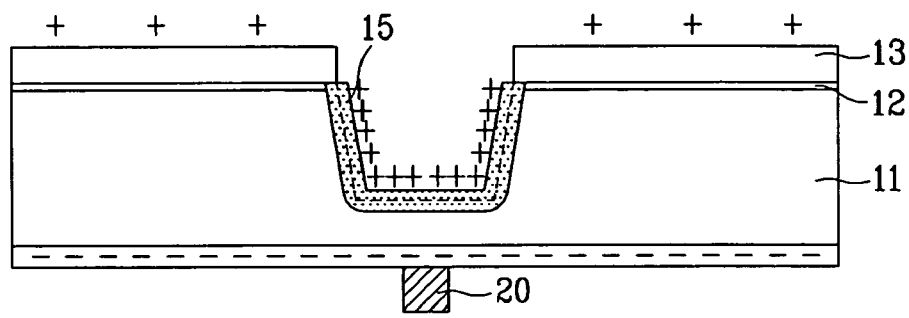
Figure 2E:
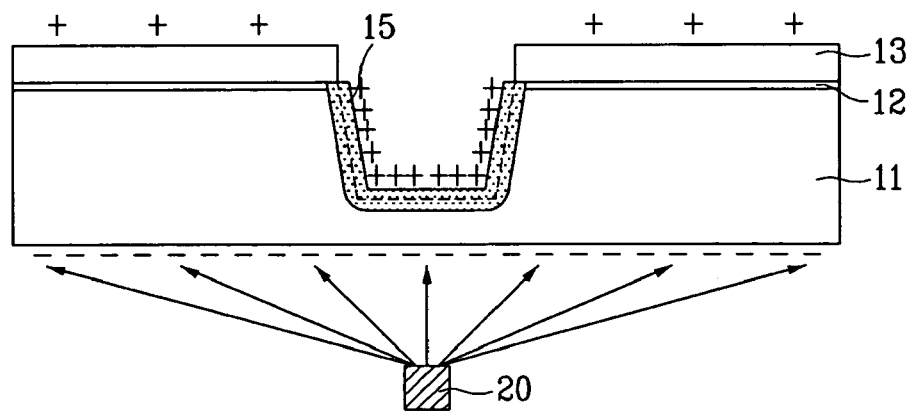

Next, as shown in FIG. 2d, a negative (−) voltage of −2000V to −1000V is applied to a back surface of the semiconductor substrate 11. An electrostatic chuck (ESC) 20 can be used for this voltage application, however it is not limited thereto. For example, the negative voltage may be directly applied using any electrode. As another method of applying the negative voltage, as shown in FIG. 2e, electrons can be injected into the back surface of the semiconductor substrate 11 using an electron gun 20. According to one example, for the electron injection, a voltage of −2000V to −1000V is applied to the back surface of the semiconductor substrate 11.

When the negative voltage is applied to the back surface of the semiconductor substrate, as described above, positive (+) charges are stored in the front surface of the semiconductor substrate 11. At this time, the positive charges stored in the liner oxide film 15 are more than those stored in the silicon nitride film 13, which is thicker than the liner oxide film 15.

This can be seen from the following mathematical expression 1 showing that an electrostatic capacity C is proportional to an area A of a dielectric and is inversely proportional to a thickness d of the dielectric.

$$C = (A/d) \times \in \qquad (1)$$

Where, $\in$ means a dielectric constant. Dielectric constants of the liner oxide film 15 and the silicon nitride film 13 are 4.3 and 7.2, respectively. A thickness of the liner oxide film 15 is about 300 Å and a thickness of the silicon nitride film 13 is about 2000 Å. Accordingly, charges stored in the relatively thin liner oxide film 15 are even more than those stored in the relatively thick silicon nitride film 13.

Figure 2F:
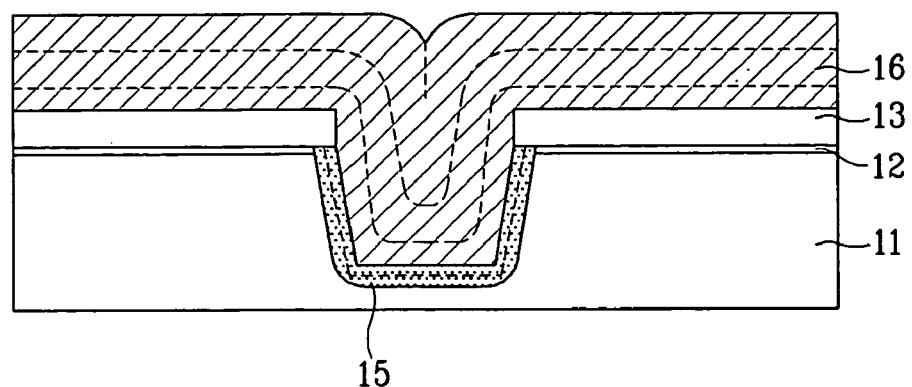

Next, as shown in FIG. 2f, a field oxide 16 is thickly deposited on an entire surface of the liner oxide film 15 and the silicon nitride film 13 such that the trench is sufficiently filled. The field oxide 16 is formed by an atmospheric pressure chemical vapor deposition (APCVD) method or a sub-atmospheric chemical vapor deposition (SACVD) method. In this course, reactive gas particles for deposition assume negative (−) charges through decomposition and generation steps, and are electrically and chemically combined to the substrate assuming positive (+) charges, resulting in the deposition of the field oxide 16.

Because positive (+) charges stored in the liner oxide film 15 are even more than those stored in the silicon nitride film 13, the field oxide 16 is still lively deposited on the liner oxide film 15. In other words, a speed of deposition of the field oxide 16 in the trench 100 is higher than that on the silicon nitride film 13. As a result, the trench 100 can be completely filled with the field oxide 16 without any void.

Finally, the trench isolation process may be completed by chemical mechanical polishing and planarizing the field oxide 16 until the silicon nitride film 13 is exposed.

As described above, by injecting electrons into the back surface of the semiconductor substrate using an electron gun, positive charges are stored in the liner oxide film and the silicon nitride film located on the front surface of the semiconductor substrate such that positive charges are more stored in the liner oxide film and are less stored in the silicon nitride film thicker than the liner oxide film. Under this state, because the field oxide for filling the trench is deposited on the entire surface the liner oxide film and the silicon nitride film, the speed of deposition of the field oxide in the trench is higher than that on the silicon nitride film. Accordingly, the trench can be completely filled with the filled oxide without any void.

Accordingly, the deterioration of the reliability of device due to a leakage current or circuit short by voids can be prevented and the device yield can be improved.

As disclosed herein, example semiconductor device manufacturing methods fill a trench formed as a field region to isolate one active region from another in a semiconductor device with insulation material without any void. In particular, an example trench formation method is characterized in that electrons are scanned to a back surface of a semiconductor substrate by an electron gun and a trench is filled with an insulation film under a state where positive charges are more stored in a relatively thin liner oxide film and are less stored in a relatively thick silicon nitride film.

One example method includes forming a silicon nitride film on an entire surface of a semiconductor substrate, forming the trench by etching the silicon nitride film and the semiconductor substrate up to a predetermined depth, forming a liner oxide film with a thickness thinner than that of the silicon nitride film on an inner wall of the trench, applying a negative voltage to a back surface of the semiconductor substrate, and forming an insulation film to fill the trench on the liner oxide film.

In one example, the silicon nitride film is formed at a thickness of 1000-3000 Å, and the liner oxide film is formed at a thickness of 100-500 Å by a thermal oxidation process. By way of further example, the application of the negative voltage includes applying a voltage of −2000V to −1000V to the back surface of the semiconductor substrate. The voltage application may be accomplished by applying the negative voltage to the back surface of the semiconductor substrate using an electrostatic chuck (ESC) or by injecting electrons into the back surface of the semiconductor substrate using an electron gun.

In one example, forming the insulation film may include forming a filling oxide-film to fill the trench on an entire surface of the silicon nitride film and then chemical mechanical polishing the oxide film until the silicon nitride film is exposed. According to one example, the filling oxide film is formed at a thickness of 6000-12000 Å using an atmospheric pressure chemical vapor deposition (APCVD) method or a subatmospheric chemical vapor deposition (SACVD) method.

By way of example, prior to the step of forming the silicon nitride film, a pad oxide film may be formed at a thickness of 100-300 Å on the entire surface of the semiconductor substrate.

Although certain example methods and semiconductor devices are disclosed herein, the scope of coverage of this patent is not limited thereto. On the contrary, this patent covers every apparatus, method and article of manufacture fairly falling within the scope of the appended claims either literally or under the doctrine of equivalents.

What is claimed is:

1. A method of forming a trench in semiconductor device, the method comprising:
    forming sequentially a pad oxide film and a silicon nitride film on an entire surface of a semiconductor substrate;
    forming the trench by etching the silicon nitride film and the semiconductor substrate up to a predetermined depth;
    forming a liner oxide film with a thickness thinner than that of the silicon nitride film on an inner wall of the trench;
    applying a negative voltage to a back surface of the semiconductor substrate such that the liner oxide film of the trench stores more positive charges the silicon nitride film, wherein applying the negative voltage includes using injecting electrons into the back surface of the semiconductor substrate using an electron gun; and
    forming a filling oxide film by atmospheric pressure chemical vapor deposition (APCVD) or subatmospheric chemical vapor deposition (SACVD) on a surface of the liner oxide film of the trench and the silicon nitride film by depositing a field oxide while the liner oxide film of the trench stores more positive charges than the silicon nitride film, wherein a deposition rate of the field oxide on the liner oxide film of the trench is higher than a deposition rate of the field oxide on the silicon nitride film.

2. A method as defined by claim 1, wherein applying the negative voltage comprises applying a voltage of −2000V to −1000V to the back surface of the semiconductor substrate.

3. A method as defined by claim 1, wherein forming the silicon nitride film comprises depositing nitride to a thickness of about 1000-3000 Å.

4. A method as defined by claim 1, wherein forming the liner oxide film comprises forming an oxide layer having a thickness of about 100-500 Å by thermal oxidation process.

5. A method as defined by claim 1, further comprising chemical mechanical polishing the filling oxide film until the silicon nitride film is exposed.

6. A method as defined by claim 5, wherein forming the filling oxide film comprises depositing oxide to a thickness of about 6000 to 12000 Å.

7. A method of forming a semiconductor device comprising:
    a) forming a pad oxide film on a surface of a semiconductor substrate and a silicon nitride film on the pad oxide;
    b) forming a trench by etching the silicon nitride film and the semiconductor substrate up to a predetermined depth;
    c) forming a liner oxide film on an inner wall of the trench, the liner oxide film having a thickness less than that of the silicon nitride film;
    d) injecting electrons into a back surface of the semiconductor substrate using an electron gun to apply a negative voltage to the back surface of the semiconductor substrate such that the liner oxide film stores more positive charges than the silicon nitride film; and
    e) depositing a field oxide film by atmospheric pressure chemical vapor deposition (APCVD) or subatmospheric chemical vapor deposition (SACVD) on a surface on the liner oxide film and the silicon nitride film while the liner oxide film stores more positive charges than the silicon nitride film, wherein a deposition rate of the field oxide on the liner oxide film is higher than a deposition rate of the field oxide on the silicon nitride film.

8. A method as defined by claim 7, wherein applying the negative voltage comprises applying a voltage of −2000V to −1000V to the back surface of the semiconductor substrate.

9. A method as defined by claim 7, wherein the field oxide film has a thickness of about 6000-12000 Å.

10. A method as defined by claim 7, wherein forming the silicon nitride film comprises depositing nitride to a thickness of about 1000 to 3000 Å.

11. A method as defined by claim 7, further comprising chemical mechanical polishing the field oxide film to expose the silicon nitride film.

12. A method as defined by claim 7, wherein forming the pad oxide film comprises depositing oxide to a thickness of about 100-300 Å.

13. A method as defined by claim 7, wherein forming the liner oxide film comprises thermal oxidation.

14. A method as defined by claim 7, wherein the liner oxide has a thickness of about 100-500 Å.

15. A method as defined by claim 7, wherein forming a field oxide comprises substantially filling the trench with an oxide.

16. A method as defined by claim 7, further comprising forming and patterning a photoresist film prior to expose an area of the silicon nitride where the trench will be formed.

17. A method as defined by claim 7, wherein forming the trench comprises a first dry etching step comprising etching the silicon nitride film in first etching conditions and a second dry etching step comprising etching the silicon substrate in second etching conditions different from the first etching conditions.

18. A method as defined by claim 7, wherein etching the silicon nitride film and the semiconductor substrate forms angles of greater than 90° where sides and a bottom of the trench meet.

* * * * *